United States Patent [19]

Stanley

[11] Patent Number: 5,513,094
[45] Date of Patent: Apr. 30, 1996

[54] SWITCH-MODE POWER SUPPLY FOR BRIDGED LINEAR AMPLIFIER

[75] Inventor: Gerald R. Stanley, Osceola, Ind.

[73] Assignee: Crown International, Inc., Elkhart, Ind.

[21] Appl. No.: 413,192

[22] Filed: Mar. 27, 1995

Related U.S. Application Data

[63] Continuation of Ser. No. 160,068, Nov. 30, 1993, abandoned.

[51] Int. Cl.⁶ .................................. H02M 3/24; G05F 1/40
[52] U.S. Cl. ................................ 363/98; 363/41; 323/266
[58] Field of Search .................................. 323/272, 266, 323/222, 259, 344, 350, 268, 282; 363/17, 98, 79, 132, 41

[56] References Cited

U.S. PATENT DOCUMENTS 3,414,802  12/1968  Harrigan et al. .................. 323/268 X
4,788,452  11/1988  Stanley .................................. 307/71
5,045,990   9/1991  Stanley ................................ 363/43

FOREIGN PATENT DOCUMENTS 1146643  3/1985  U.S.S.R. ............................ 323/272

OTHER PUBLICATIONS

"A G00W Four-Stage Phase-Shifted-Parallel DC-DC Converter", IEEE, apr. 1987.
"A Pulsewidth-Modulated Inverter with Parallel Connected Transistors Using Current-Sharing Reactors," IEEE, Apr. '93.
"Phase-Staggering Control of a Series-Resonant DC-DC Converter with Paralleled Powers Modules," IEEE, Apr. '88.

Primary Examiner—Peter S. Wong
Assistant Examiner—E. Tso
Attorney, Agent, or Firm—Baker & Daniels

[57] ABSTRACT

A power converter which includes a bridged power amplifier powered from a sole or single DC input power source through a plurality of parallel connected PWM buck converters. The converters are modulated with reference signals which operate in time alternation such that in any conversion cycle there exists a plurality of modulating wave forms which are identical except for their time delays and which are evenly spaced in time over a single conversion cycle. A feedback control amplifier compares the voltage output of the parallel connected converters through the magnitude of the amplifier's required supply voltage and drives the modulating components of the circuit to control the switching duty cycle of each of the individual PWM converters.

14 Claims, 5 Drawing Sheets

SWITCH-MODE POWER SUPPLY FOR BRIDGED LINEAR AMPLIFIER

This is a continuation of application Ser. No. 08/160,068, filed Nov. 30, 1993, now abandoned.

BACKGROUND OF THE INVENTION

Bridged power amplifiers have a particularly simple power supply format in that only a two terminal supply is required. Such amplifiers offer high power, such as in the tens of kilowatts with wide bandwidth and very low distortion and noise which makes them nearly ideal for precision amplification applications such as gradient amplifiers for magnetic resonance imaging. These amplifiers have though an inherent deficiency in that they are of low power efficiency. Such low or reduced efficiency results in large amounts of semi-conductor materials being used for pass devices and large heat sinks being used to receive the generated and wasted heat due to amplifier operation.

Another type of an amplifier, the switch-mode pulse width modulation (PWM) amplifier, offers improved power efficiency but suffers greatly from poor bandwidth and poor fidelity. PWM bandwidth is typically an order of magnitude less than needed for many applications. Operating with switch frequencies in the megaHertz range in order to attain the necessary bandwidth results in low efficiency and is, therefore, not practical. The use of megaHertz operating frequencies is especially difficult and costly if the output power measures in the tens of kilowatts.

It is known in the practiced art to use two separate PWM buck mode power supplies to power the traditional totem-pole topology (non-bridge) linear amplifier. In addition to requiring two PWM supplies, whereas bridge designs require only one supply, the designs have required either an excessive or inefficient operating efficiency and/or precognition of the amplifier's input signal to allow the slowly responding power supply to get a head start on producing the necessary supply voltage transients. The only method of such precognition that is feasible for many such systems is to delay the main amplified signal by a multiple of milliseconds which is the response time needed by a slow PWM supply. For many uses, such delays of the amplified signal are not allowed nor desirable. In attempting to make a PWM buck supply faster, typically the output voltage ripple from the converter is compromised, and at low operating currents, the output ripple voltage contains large amounts of switching subharmonics as cycle-skipping behavior is manifested by the converter. The missing of cycles is common when a buck converter operates at near zero duty cycle to produce small output currents.

In the use of bridge linear power amplifiers, the application of multi-level signal tracking power supplies for the purpose of powering the amplifiers, such as described in U.S. Pat. Nos. 4,788,452 and 5,045,990, are capable of providing amplifier system efficiencies which are much improved over the basic Class B operation with fixed DC supplies. Therefore, in the concept of the following described invention, a multiple of separate PWM buck mode power supplies are utilized in conjunction with a bridge linear power amplifier to produce and provide a high-efficiency fast precision amplification system which does not suffer from the deficiencies referred to above with respect to the heretofore utilized PWM and bridge linear power amplifiers.

SUMMARY OF THE INVENTION

In this invention a bridge linear power amplifier is powered by a plurality of PWM buck converters which are operated in parallel. Each converter shares a common DC input power source and is joined to a common pair of output terminals. The output terminals are applied to the power supply terminals of the bridge linear power amplifier. The buck converters are modulated with modulation reference signals which operate in time alternation such that in any conversion cycle there exists a plurality of modulating wave forms which are identical except for their time delays and which are evenly spaced in time over one conversion cycle. A feed back control amplifier compares the voltage output of each converter to the magnitude of the amplifiers required supply voltage and drives the modulators to control the switching duty cycle of each of the individual PWM converters.

Accordingly, it is an object of this invention to provide a high efficiency fast precision amplification system capable of producing power in the tens of kilowatts.

Another object of this invention is to provide a power amplifier having a high operating efficiency at reasonable cost.

A further object of this invention is to provide a power amplifier which utilize PWM buck converters having minimum valued capacitance and inductance in their output filters to allow a sufficiently high-speed tracking signal that needs no precognition in the control system.

Still another object of this invention is to provide a power supply for a bridge linear power amplifier which allows fixed frequency operation with a clock frequency which can be synchronized to external system clocks, thus preventing beat frequencies forming in the system noise.

And still a further object is to provide a bridge linear power amplifier having a PWM buck power supply converter in which the spectral intensity of the supply ripple current induced noise resulting from cycle-skipping at low operating currents is reduced with any remaining supply ripple current induced noise becoming incoherent with likely repetitious control signals.

Further objects of this invention will become apparent from a reading of the following description.

DESCRIPTION OF THE PREFERRED EMBODIMENT

The preferred embodiment illustrated is not intended to be exhaustive or to limit the invention to the form so disclosed.

Rather it is chosen and described in order to best explain the principles of the invention and to allow one having ordinary skill in the art to utilize the invention.

Figure 1:
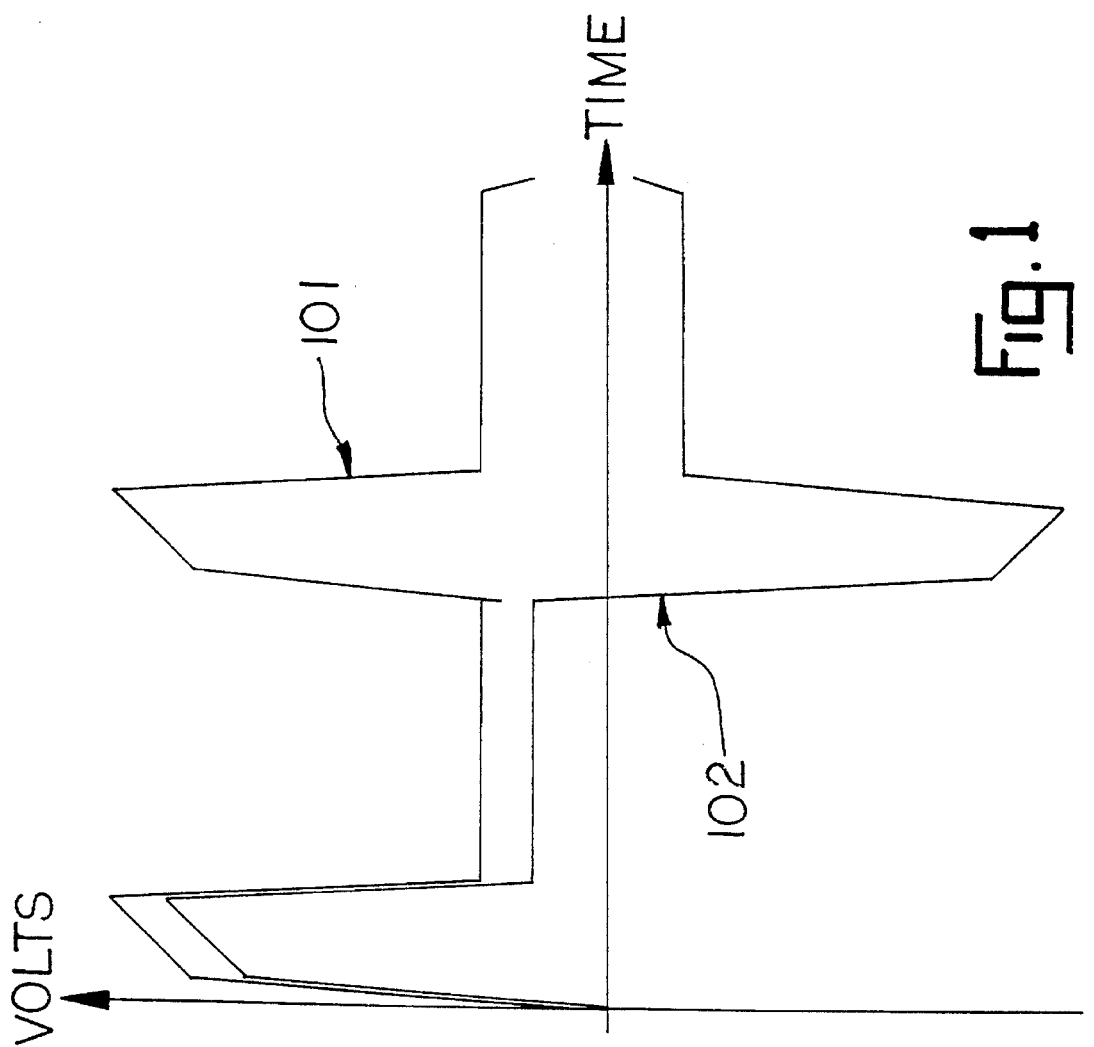
FIG. 1 is a representative set of wave forms showing a representative output voltage signal from the bridge power amplifier of this invention in conjunction with the necessary amplifier supply voltage in which to support or produce such an amplifier output signal.

In FIG. 1 an idealized amplifier supply voltage 101 is shown to produce the amplifier output voltage 102. The supply voltage is slightly larger than the magnitude of the amplifier's output voltage with the greater the supply voltage the more such voltage must be lost to the dissipating output stages of the power amplifier. Since the amplifier requires some voltage loss to be able to provide control, it is not possible to make the difference between the supply voltage and the amplifier's output voltage zero. Further, additional losses of the supply voltage are due to amplifier internal impedances which will further cause a necessary difference between the supply voltage and the output voltage of the amplifier system. Thus, minimization of such losses or amplifier dissipation requires that the tracking supply be very precise. Obviously, the faster the change of power demand in the amplifier voltage, the faster must be the tracking power supply.

Switching power supplies can offer high efficiency if the switching element can obtain low on values of resistance and low switching event losses. The switching event losses are proportional to operating frequency and, therefore, operating frequencies can not be increased without limitation but what the losses become unacceptable. Buck topology is well suited to providing control of the output voltage to values as low as zero and at currents approaching zero. The maximum buck converter output voltage is limited to the supply input voltage. In the amplifier system of this invention it is desirable to produce voltages in the order to 200 v and 200 amps. The minimum voltage required from the power supply is a small operating headroom voltage in the order of approximately 10 v and at currents as small as 100 mA. Thus the converter output dynamics power ratio is extremely large such as in the order of 40,000×. In some applications, such as in magnetic resonance imaging, the output voltages may be required to slew at 40 v per microsecond which implies that the converter have a power bandwidth in the order of 75 KHz. A 75 KHz bandwidth requires a switching frequency in the order of 1 MHz. Such high switching frequencies can result in switching event losses which are totally unacceptable. If the switch frequency is lowered it is difficult to filter out the switching ripple in the converter output.

Figure 2:
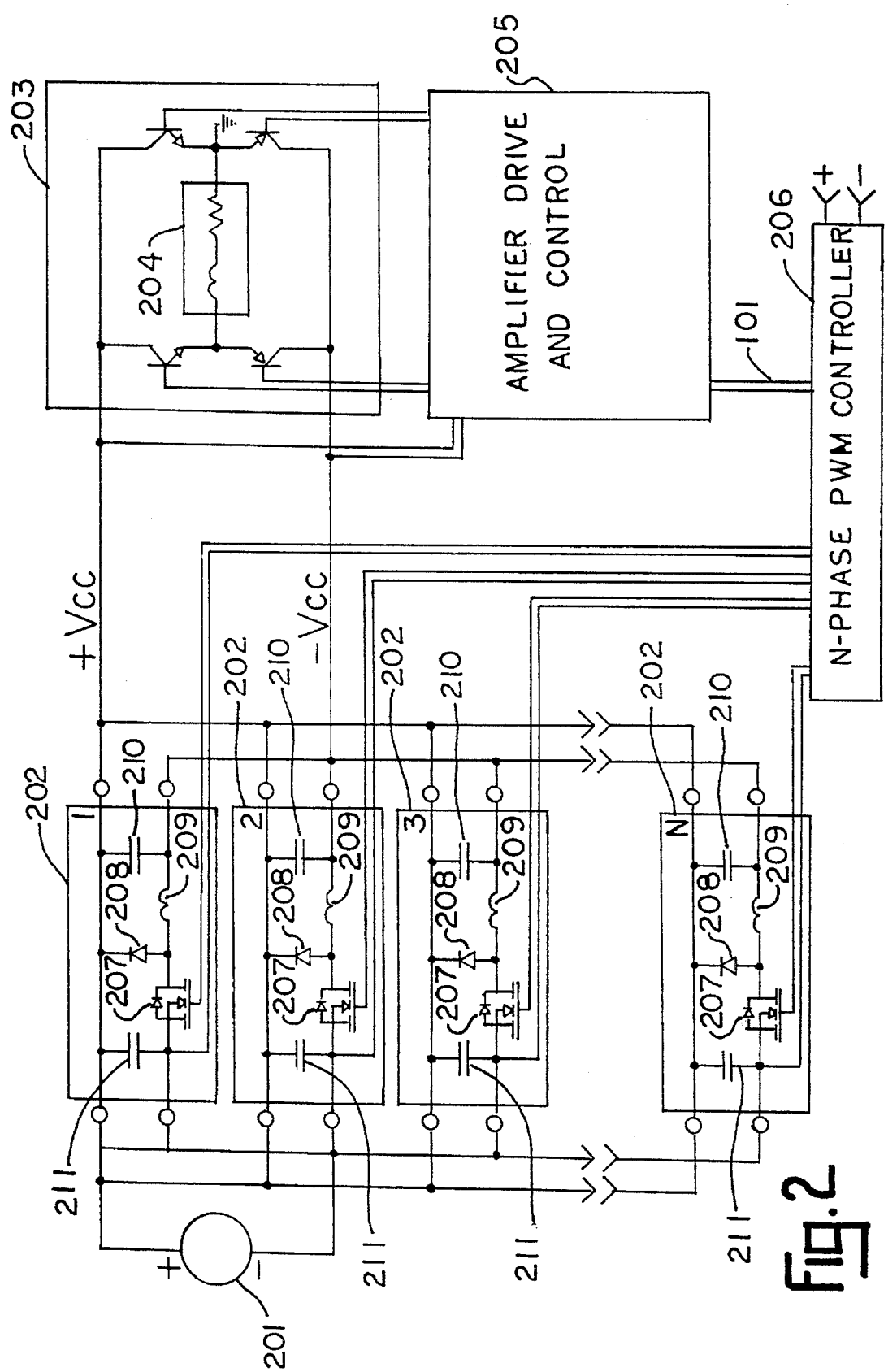
FIG. 2 is a block diagram of the bridge linear power amplifier system of this invention showing a group of PWM buck converters joined to the power supply terminals of the amplifier, forming a common load.
Figure 3:
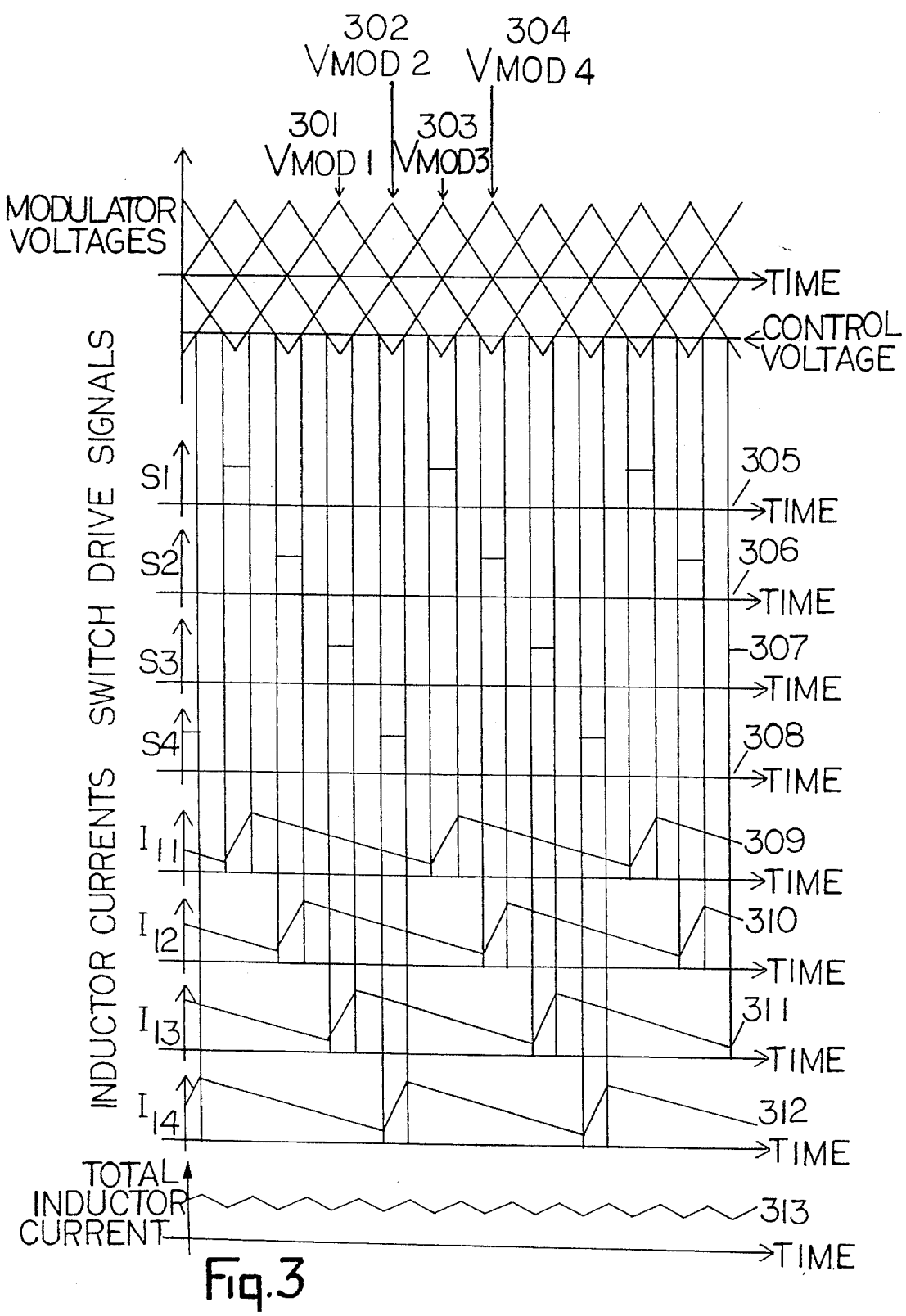
FIG. 3 is a set of modulated wave forms fed to four PWM buck converters operated in parallel and subjected to individual switch drive signals with the resulting buck converter produced inductor currents as the combined total inductor current fed to the power input of the power amplifier.

FIG. 3 is a wave form diagram in which four buck-mode converters 202, such as seen in FIG. 2, are utilized for illustrative purposes. The number of buck mode converters 202 utilized in the system will depend upon the desired maximum output of the bridged power amplifier 203, also seen in FIG. 2. In FIG. 3 at the top of the diagram is shown the modulator voltages and control voltage or signal fed specifically to each pulse width modulator. These respective voltages (modulator voltage and control voltage) produce pulse width modulated switch drive signals S1, S2, S3, S4, in each of the respective buck converters which in turn produce the inductor currents I11, I12, I13, and I14 produced in the time lag sequences illustrated for each of the converters which is summed into the total inductor current 313 fed to the bridged amplifier. The switch drive signals for each of the converters are designated respectively by the numbers 305, 306, 307, and 308 and the induced or inductor currents produced by each of the specific converters is shown by the lines 309, 310, 311, 312 respectively for the four converters. When using such time interleaved (polyphasic converters) the effective operating frequency is the sum of the individual operating frequencies while the net output current ripple is greatly reduced. This allows for the construction of output filter with reduced output capacitance for the required attenuation. The result is that the large required bandwidth is obtainable with a plurality of economically constructed buck converters.

Referring now to the overall amplifier system shown in FIG. 2, the buck converters 202 are shown connected in parallel and individually numbered 1, 2, 3, and N which represents a specific number of such parallel connected converters depending upon the available output of the converters in relationship to the desired power input to the connected bridge amplifier 203. While for illustrative purposes in describing this invention, four such buck converters 202 are utilized in order to simplify the current diagram in FIG. 3, is to be understood in order to produce a 2 MHz effective maximum operating frequency for the bridge amplifier, eight 250 KHz buck converters 202 would be utilized and connected in parallel. Each converter 202 includes a MOSFET switch 207, a free-wheeling diode 208, an output coil or inductor 209, an input bypass capacitor 211, and an illustrative output capacitor 210. While in FIG. 2 there are individual output capacitors 210 shown, it is possible since the capacitors are utilized in parallel to provide a single capacitor in the circuit. Each buck converter 202 needs only to produce a fraction of the total desired output current for the bridge amplifier. As an example, for a 200 A total output, eight buck converters need only individually produce a 25 A phase to meet the total output current requirement. Twenty five amp inductors 209 are far easier to construct and are more compact then a large inductor able to handle the total output current requirement of 200 A.

There are two basic buck-converter topologies which would be capable of using the shown and preferred N-channel MOSFET switches 207. The topology shown in FIG. 2 is chosen for its ease of implementation of the gate drivers of the MOSFETs. The other basic buck converter topology would place the N-channel MOSFET drain terminal on the positive supply node and the MOSFET source terminal on the inductor-diode (209, 208) node. The inductor 209 then would be connected to the positive output terminal and not the negative terminal as is shown in FIG. 2. This described but not shown buck converter topology requires separate supplies for the gate drivers of each phase and the coupling of the gate drive signals across a very high dV/dt interface from the common-to-all-phases controller 206 at a greatly increased cost and complexity.

A single power supply for the parallel connected buck converters 202 comes from a main DC power supply 201 which may be in the range of 180 to 200 V. The phase control for converters 202 is produced by PWM controller 206 shown in FIG. 2. An amplifier driver control 205 which may be generally of the type illustrated in U.S. Pat. No. 3,808,545 is connected between bridged amplifier 203 and controller 206. Amplifier driver control 205 produces a demand signal 101 which actuates PWM controller 206 which in turn produces the desired input current through buck converters 202 to the bridge amplifier depending upon the demand situation.

Figure 4:
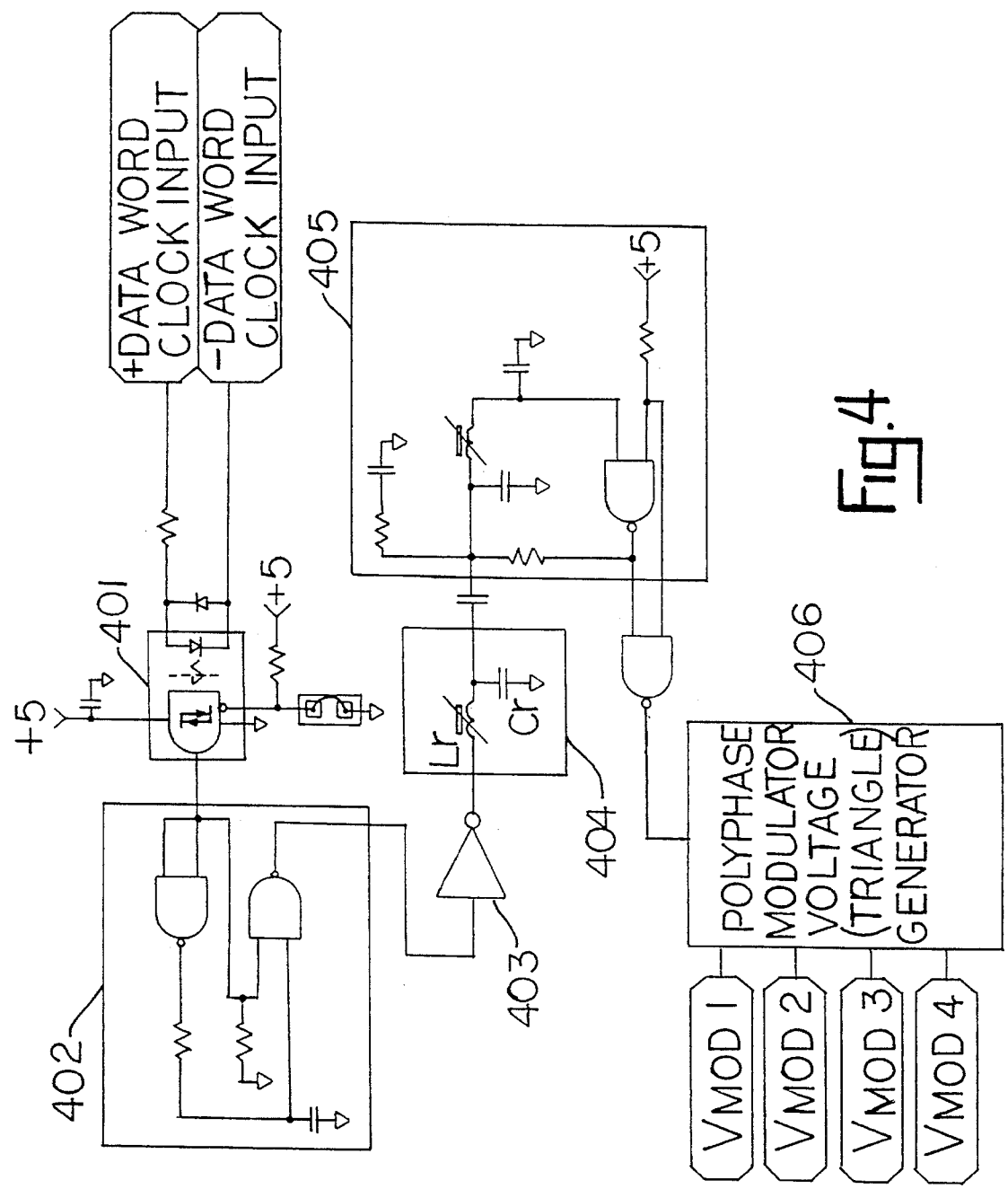
FIG. 4 is a combined circuit and block diagram for phase synchronizing a Pierce oscillator from a digital synchronous input signal utilized in the PWM controller shown in FIG. 2.

PWM controller 206 includes the synchronized oscillator shown in FIG. 4. The Pierce oscillator 405 of FIG. 4 oscillates at the intended frequency without any input from a data clock. Should a data clock signal be supplied, the oscillator output will assume a unique phase relationship with the harmonic of the data clock which is at the free-running frequency of the oscillator. A large number of integer multiples of frequency are possible for phase locking so long as there is a harmonic of the data clock close to the free-running frequency of the oscillator. The series LC resonator 404 is tuned to resonate at the oscillator frequency and will be excited by any appropriate sub-harmonic. The circuit of 402 in FIG. 4 produces a controlled width pulse which stimulates the resonator 404. Circuit 401 produces a single edged triggered pulse from the data clock which eliminates duty cycle sensitivity. The Q of the resonator 404 is maintained as high as possible which requires that the resonator be driven from a low resistance source such as CMOS buffer 403. The use of sinusoidal current injection into the oscillator 405 eliminates multiple edge outputs from the oscillator during lockup with phase lock being smooth and very quick. Synchronous signals are produced by the word clocks shown in the figure.

The converter modulation wave forms shown in FIG. 3 (301–304) are derived from the polyphase modulator voltage generator 406 shown in FIG. 4. The clocked input of the synchronized oscillator generates a group of phase shifted 50% duty cycle pulses which are in turn converted to the triangular waves shown in FIG. 3. The triangular waves are applied to one input terminal of a comparator while the control voltage shown in FIG. 3 is applied to the other input of the comparator. The result at the output of the comparator when combined with the appropriate control signal or voltage is a set of width modulated pulses (305–308) which are individually coupled through high-speed optical oscillators to drive gate drivers which in turn drive the MOSFETs 207 shown in FIG. 2 as is the common practice in PWM products.

Some precision applications of the resulting power amplifier use sample data systems that supply input wave forms digitally and process the system outputs in time synchrony with the input. Small amounts of high frequency noise when present in the output of such systems can result in small but serious (beat frequency) signals when multiples of the data frequency combine with the high frequency noise. The "beat" disturbance can be reduced to zero frequency by phase locking the tracking converter to the data clock such as illustrated in FIG. 4.

Figure 5:
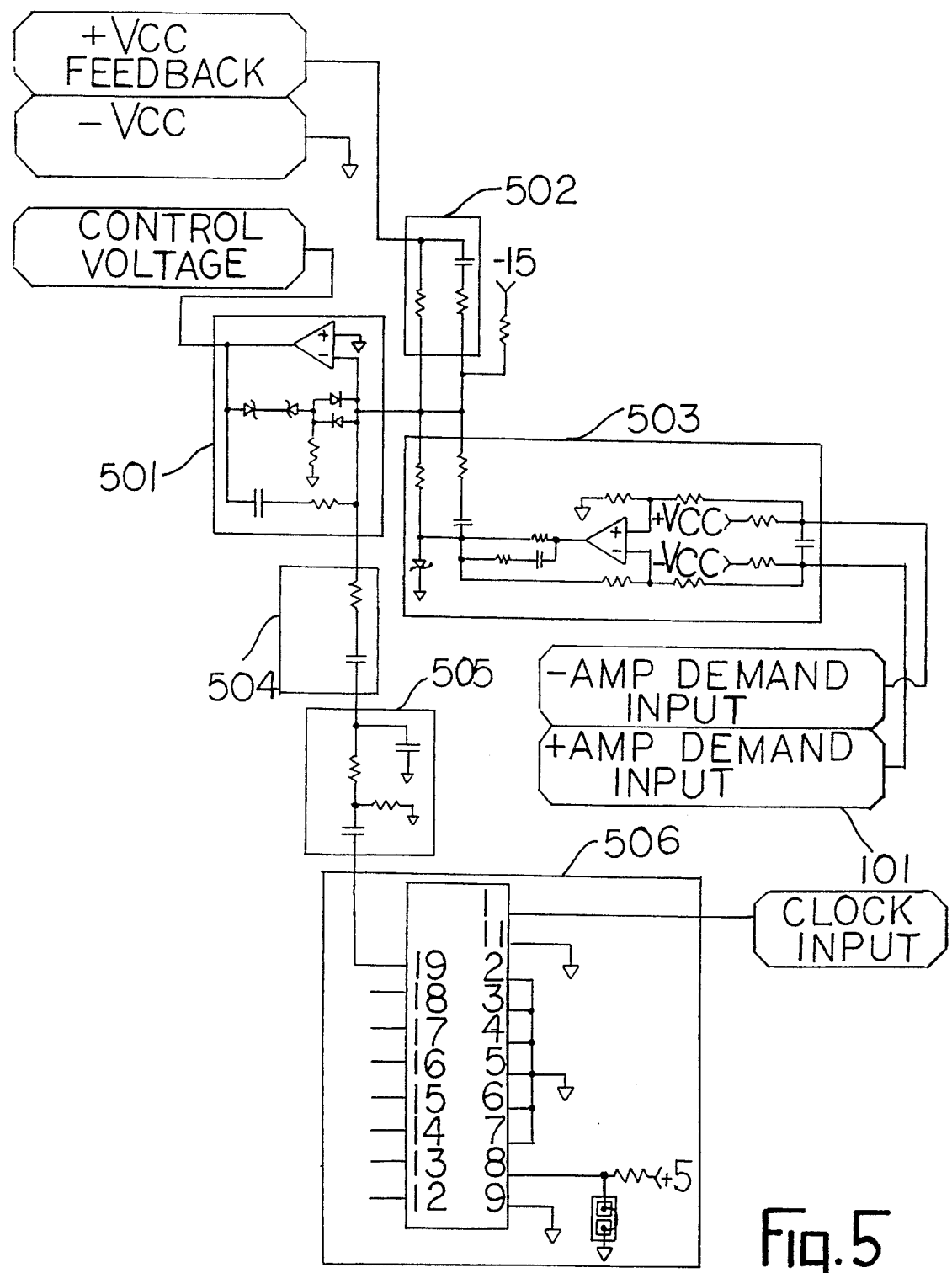
FIG. 5 is a random noise generator circuit diagram utilized to produce the control voltage for the modulated signal fed to the buck converters and which also forms a part of the PWM controller shown in FIG. 2.

Included within PWM controller 206 is the noise generator shown in FIG. 5. The voltage error amplifier circuit 501 of FIG. 5 produces the control voltage which is used to produce the width modulated pulses 305–308 shown in FIG. 8. The digital pseudo-random noise (PRN) generator 506 shown in FIG. 5 provides a signal source to the voltage error amplifier circuit 501. Bypass filter 505 is used to remove the DC output term of the source and shape the amplitude distribution into a more Gaussian form. It is possible to create a spectrum of noise at the output of the voltage error amplifier circuit 501 identical to the noise source if the injected signal into the amplifier's virtual ground produced by the RC network 504 has the same time constant as the RC network which composes the feedback network of amplifier circuit 501. RC network 504 includes a lag feedback resistor (Rlfb) and a lag feedback capacitor (Clfb) with the resistor being multiplied by a constant and the capacitor being divided by a constant which is used to scale level.

When high-frequency supplies are required to regulate at very low output currents, it is not unusual that it will be necessary for their controller to invoke cycle skipping. The underlying problem is that the required output current is less than the operating frequency times the minimum charge delivered per switch cycle. Each time that a buck converter switch engages, a certain minimum amount of charge is transferred to the output circuit. Since the controller cannot reduce this charge, the only thing that it can do is to reduce the rate at which charge is transferred by deleting some of the switch events. The most likely result is that cycles will be skipped on a periodic basis resulting in sub-harmonic voltage ripple on the output waveform. The converter's output filter is not as effective when the ripple frequencies are reduced. This supply noise may also not be completely rejected by the amplifier and appear at low level in the output signal. Some applications are severely disturbed by having periodic noise in the output signal.

It is possible to randomize the cycle skipping phenomena if a noise-like signal is introduced into the control loop composed of feed back or error amplifier circuit 501 and feed back network 502 of the supply. Input signal to the control loop is supplied by a differential receiver 503 which acts to give frequency emphasis and limiting to the power amplifier voltage demand signal.

The bridge linear amplifier 203 connected to its load 204 and supplied by a single source power supply regulated through a multiple parallel connected PWM buck converters 202 produces a high efficiency amplification system of relative low cost and exceptionally fast speed. The amplifier drive and control 205 causes controller 206 precisely switch the MOSFETs of buck converters 202 which in turn, as illustrated by FIG. 3, produce an input power current to the bridge amplifier in precise increments depending upon the demand level placed upon the amplifier by its load 204. The modulating frequency of each converter 202 is high enough to allow the construction of an effective switch-mode supply output filter 209, 210 whose pass band is large enough to allow output of the fastest currents required by the bridge amplifier.

The above invention is not to be limited to the details so described therein but may be modified within the appended claims.

What I claim is:

1. An amplifier power supply circuit comprising a power amplifier having a power input, a plurality of pulse width modulated switch-mode power converter means connected in parallel and adapted for connection to a DC power supply, each converter means for tracking the power demand for said amplifier, all said converter means collectively for outputting current from said power supply to said amplifier power input, each converter means including an operating frequency which is phase locked to a sampled data input having a data rate, a pulse width modulated controller means for sensing the power input demands of said amplifier and in response thereto producing a pulse width modulated switch drive signal for each said converter means, said controller means including a free-running oscillator and phase lock circuitry including a resonate circuit stimulated by a data rate clock pulse for synchronizing said oscillator in producing each said pulse width modulated switch drive signal.

2. The amplifier power supply circuit of claim 1 wherein said controller means includes a noise generator means for supplying a control voltage which in conjunction with modulator voltage created by said oscillator produces said pulse width modulated switch drive signal, said generator means for producing a random noise signal for injection into a supply control loop forming a part of said controller means to randomize the amplifier power supply circuit operation at low values of said collective output current.

3. The amplifier power supply circuit of claim 2 wherein said noise generator is a digital pseudo-random type.

4. An amplifier power supply circuit comprising a power amplifier having a power input, a plurality of pulse width modulated switch-mode power converter means connected in parallel and adapted for connection to a DC power supply, each converter means for tracking the power demand for said amplifier, generator means for producing a plurality of identical modulating voltage wave forms except for equal time delays, means for converting said wave forms into a plurality of pulse width drive signals to sequentially switch said converter means, all said converter means collectively for outputting current from said power supply to said amplifier power input when each converter means is switched on.

5. The amplifier power supply circuit of claim 4 wherein said amplifier is of the a bridge type.

6. The amplifier power supply circuit of claim 2 wherein said amplifier has a grounded output terminal.

7. The amplifier power supply circuit of claim 4 wherein each said converter means for operating in a separate current producing phase selected mode so as to minimize output ripple and increase the effective switching rate of the collective output current of all said converter means.

8. The amplifier power supply circuit of claim 7 wherein each said converter means includes a switch-mode supply output filter means for allowing outputting of a fastest current required by said amplifier at its said power input.

9. The amplifier power supply circuit of claim 7 wherein each said converter means is of a buck-derived topology.

10. The amplifier power supply circuit of claim 9 wherein each converter means includes a three-terminal switch means receptive to a pulse width modulated drive signal and having a control common terminal adapted for connection to one terminal of said power supply.

11. The amplifier power supply circuit of claim 4 wherein said amplifier is a bridge type.

12. The amplifier power supply circuit of claim 11 wherein said amplifier has a grounded output terminal.

13. The amplifier power supply circuit of claim 4 wherein each said amplifier means includes a switch-mode supply output filter means for allowing outputting of a fastest current required by said amplifier at its said power input.

14. The amplifier power supply circuit of claim 4 wherein each said converter means is of a buck-derived topology.

* * * * *